United States Patent [19]

Jeffries, III et al.

[11] Patent Number: 5,346,799

[45] Date of Patent: Sep. 13, 1994

[54] NOVOLAK RESINS AND THEIR USE IN RADIATION-SENSITIVE COMPOSITIONS WHEREIN THE NOVOLAK RESINS ARE MADE BY CONDENSING 2,6-DIMETHYLPHENOL, 2,3-DIMETHYLPHENOL, A PARA-SUBSTITUTED PHENOL AND AN ALDEHYDE

[75] Inventors: Alfred T. Jeffries, III; David J. Brzozowy, both of Providence, R.I.

[73] Assignee: OCG Microelectronic Materials, Inc., West Paterson, N.J.

[21] Appl. No.: 986,223

[22] Filed: Dec. 7, 1992

Related U.S. Application Data

[63] Continuation-in-part of Ser. No. 812,498, Dec. 23, 1991, abandoned.

[51] Int. Cl.$^5$ .................. G03F 7/023; G03F 7/30
[52] U.S. Cl. .................. 430/192; 430/165; 430/191; 430/193; 430/270; 528/129; 528/153; 528/155
[58] Field of Search ............ 430/191, 192, 193, 165, 430/270; 528/153, 155, 129

[56] References Cited

U.S. PATENT DOCUMENTS

| | | | |
|---|---|---|---|
| 4,173,290 | 11/1979 | Kobayashi et al. | 220/678 |
| 4,377,631 | 3/1983 | Toukhy et al. | 430/192 |
| 4,499,171 | 2/1985 | Hosaka et al. | 430/193 |
| 4,529,682 | 7/1985 | Toukhy | 430/190 |
| 4,587,196 | 5/1986 | Toukhy | 430/192 |
| 4,719,167 | 1/1988 | Miura et al. | 430/192 |
| 4,725,523 | 2/1988 | Miura | 430/192 |
| 4,812,551 | 3/1989 | Oi et al. | 430/165 |
| 4,839,457 | 6/1989 | Hayama et al. | 528/86 |
| 4,859,563 | 8/1989 | Miura et al. | 430/193 |
| 4,906,549 | 3/1990 | Asaumi et al. | 430/192 |
| 4,957,846 | 9/1990 | Jeffries et al. | 430/192 |
| 4,965,167 | 10/1990 | Salamy | 430/192 |
| 4,971,887 | 11/1990 | Schmitt et al. | 430/165 |
| 4,988,601 | 1/1991 | Ushirogouchi et al. | 430/192 |
| 4,992,356 | 2/1991 | Jeffries et al. | 430/165 |
| 4,992,596 | 2/1991 | Jeffries et al. | 430/326 |
| 5,019,479 | 5/1991 | Oka et al. | 430/192 |
| 5,110,706 | 5/1992 | Yumoto et al. | 430/191 |
| 5,237,037 | 8/1993 | Ebersole | 528/155 |

FOREIGN PATENT DOCUMENTS

| | | |
|---|---|---|
| 0227487 | 12/1986 | European Pat. Off. . |
| 0239423 | 3/1987 | European Pat. Off. . |
| 55-126250 | 9/1980 | Japan . |
| 60-158440 | 8/1985 | Japan . |

(List continued on next page.)

OTHER PUBLICATIONS

Chen and Rice, "Study of Dryout Resistance of Phenolic Copolymer Resins for Pine Plywood Glues–Parts I and II", Forest Products Journal, vol. 24, No. 3, pp. 20–26 (Mar., 1974) and vol. 25, No. 6, pp. 40–44 (Jun. 1975).

Hanabata, Funita, Uemura "Novolak Design for High Resolution Positive Photoresists" 1977 SPIE Conference, vol. 771, Advances in Resist Technology and Processing (IV), pp. 85–92.

Primary Examiner—Charles L. Bowers, Jr.
Assistant Examiner—John S. Chu
Attorney, Agent, or Firm—William A. Simons

[57] ABSTRACT

An alkali-soluble novolak binder resin made by the condensation reaction of a mixture of phenolic monomers with at least one aldehyde source, said phenolic monomers consisting of:

(1) about 2–18% by weight of said mixture being 2,6-dimethylphenol;

(2) about 55–75% by weight of said mixture being 2,3-dimethylphenol;

(3) about 16–40% by weight of said mixture being a para-substituted lower alkyl phenol selected from the group consisting of 3,4-dimethylphenol, para-cresol, and para-cresol dimer;

and the amount of said aldehyde source being at least a stoichiometric amount to react with all of said phenolic moieties. These novolak binder resins may be used in radiation-sensitive compositions useful as positive-working photoresists.

8 Claims, No Drawings

FOREIGN PATENT DOCUMENTS

| | | |
|---|---|---|
| 60-164740 | 8/1985 | Japan . |
| 60-176034 | 9/1985 | Japan . |
| 61-185741 | 8/1986 | Japan . |
| 61-275748 | 12/1986 | Japan . |
| 62-089040 | 4/1987 | Japan . |
| 62-121754 | 6/1987 | Japan . |
| 62-153950 | 7/1987 | Japan . |
| 62-163055 | 7/1987 | Japan . |
| 62-172341 | 7/1987 | Japan . |
| 62-227144 | 10/1987 | Japan . |
| 63-034540 | 2/1988 | Japan . |
| 63-036239 | 2/1988 | Japan . |
| 63-043134 | 2/1988 | Japan . |
| 63-234249 | 9/1988 | Japan . |
| 63-234250 | 9/1988 | Japan . |
| 63-282734 | 11/1988 | Japan . |
| 63-291052 | 11/1988 | Japan . |
| 63-291053 | 11/1988 | Japan . |
| 64-50044 | 2/1989 | Japan . |
| 01090250 | 4/1989 | Japan . |
| 01106043 | 4/1989 | Japan . |
| 01304455 | 12/1989 | Japan . |
| 0201352 | 1/1990 | Japan . |
| 02019851 | 1/1990 | Japan . |
| 02020868 | 1/1990 | Japan . |
| 02047656 | 2/1990 | Japan . |

NOVOLAK RESINS AND THEIR USE IN RADIATION-SENSITIVE COMPOSITIONS WHEREIN THE NOVOLAK RESINS ARE MADE BY CONDENSING 2,6-DIMETHYLPHENOL, 2,3-DIMETHYLPHENOL, A PARA-SUBSTITUTED PHENOL AND AN ALDEHYDE

CROSS-REFERENCE TO RELATED APPLICATION

This application is a continuation-in-part application of U.S. Pat. application Ser. No. 07/812,498, filed on Dec. 23, 1991, abandoned with Alfred T. Jeffries, III and David J. Brzozowy as named co-inventors and which is incorporated herein by reference in its entirety.

BACKGROUND OF THE INVENTION

1. Field of the Invention

The present invention is directed to selected novolak resins made from a phenolic mixture consisting of 2,3-dimethylphenol, 2,6-dimethylphenol, and selected para-substituted lower alkyl phenols and phenolic dimers. The present invention is also directed to radiation-sensitive compositions useful as positive-working photoresists containing these novolak resins.

2. Brief Description of the Prior Art

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some instances, it may be desirable to bake the imaged coated substrate after the imaging step and before the developing step. This bake step is commonly called a post-exposure bake and is used to increase resolution.

There are two types of photoresist compositions-negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresists are generally prepared by blending a suitable alkali-soluble binder resin (e.g., a phenol-formaldehyde novolak resin) with a photoactive compound (PAC) which converts from being insoluble to soluble in an alkaline aqueous developer solution after exposure to a light or energy source. The most common class of PAC's employed today for positive-working resists are quinone diazide esters of a polyhydroxy compound. Typical novolak resins used today for positive-working resins are made from various mixtures of ortho-cresol, meta-cresol, and para-cresol which are condensed with an aldehyde source (e.g., formaldehyde).

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one micron or less is necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Increased resolution has been noted in positive photoresist systems whose novolaks possess a high degree of ortho-, ortho-bonding. The term ortho-, ortho-bonding is used to refer to the location and positions of attachment of the methylene bridge between phenolic nuclei. Thus, the methylene bridge which connects two phenolic nuclei which is ortho to both phenolic hydroxyl groups is regarded as ortho, ortho.

It is thought that ortho-, ortho-bonding increases the interactions between phenolic hydroxyls in the novolak and the photoactive compound in positive photoresists compared to positive photoresists containing novolaks which lack a high degree of ortho-, ortho-bonding in their micro-structure. Although the exact character of these interactions is speculative, e.g., hydrogen bonding, van der Waals forces, and the like, there is a correlation between increased resolution and contrast observed in these positive resists whose novolaks contain a high degree of ortho-, ortho-bonding compared to positive resists whose novolaks lack this high degree of ortho-, ortho-bonding.

The optimum number of ortho-, ortho-bonds necessary for optimum interaction between the PAC and the novolak not known. However, it is noted that novolak resins which have a very high percentage of ortho-, ortho-bonding (e.g., a very high content of para-cresol in the novolak) appear to result in photoresists having scum (i.e, undesired residues in the exposed and unexposed areas). Accordingly, having the optimum number of ortho, ortho bonds distributed properly may minimize or eliminate this scum problem.

Besides the positioning of the methylene bridge in the novolak resin, it has been found that the presence of certain phenolic dimer, trimer, and lower oligomeric moieties in the novolak resin may also result in scum formation in the formed and developed images. Further, the presence of these dimers and the like also adversely affect the thermal properties of the final resist and adversely affect the dissolution times of the novolak in the developer solution. Accordingly, it is desirable to remove or prevent the formation of such undesirable moieties from the novolak resin solution before adding it into the photoresist composition.

Also, the formation of scum at the bottom of developed images has also been found to be attributed to the formation of azo-coupling products between the PAC molecule and unreacted 2-, 4-, and 6-position of the novolak phenols (i.e., where the 1-position of the phenol ring is the hydroxy position). The remaining 3- and 5- positions are relatively unreactive under both polymerization reaction conditions and azo coupling reaction conditions.

Accordingly, the present invention is directed to substantially eliminating all of the above-noted three causes of scum formation by a combination of several novolak-forming parameters.

First, the need for a sufficient but not excessive amount of ortho-, ortho-bonding is provided for by employing certain proportions of para-substituted difunctional phenolic moieties (e.g., para-cresol 3,4-dimethylphenol or para-cresol dimer) in the phenolic monomeric mixture used to make the novolak resin.

Second, the unwanted dimers, trimers, and lower oligomers are substantially eliminated by using a molar excess of aldehyde source to total phenolic monomers, as well as employing a certain low proportion of a monofunctional phenolic monomers (i.e., 2,6-dimethylphenol) as terminal groups for the novolak resin.

Third, the unwanted azo-coupling reaction can be substantially eliminated by preblocking substantially all of the reactive 2-, 4-, and 6-positions in the novolak resin.

This preblocking can be accomplished by selecting certain proportions of certain monofunctional, difunctional phenolic monomers or dimers. Monofunctional phenolic monomers are compounds which have only one 2-, 4-, or 6-position relative to the hydroxy group open or unsubstituted to reaction with other phenolic moieties during the novolak polymerization reaction with the phenolic moieties. Examples of monofunctional phenolic monomers are 2,4-dimethylphenol (also known as 2,4-xylenol) and 2,6-dimethylphenol (also known as 2,6-xylenol). Each has only one reactive site, namely the 6- and 4-positions, respectively. The difunctional phenolic monomers and dimers are compounds which have a total of two 2-, 4-, and 6-positions relative to hydroxy groups in the molecule available for reaction. An example of a difunctional phenolic monomer is 4-methylphenol (also known as para-cresol). Another example is 3,4-dimethylphenol (also known as 3,4-xylenol). They both have the 2- and 6-positions open to reaction. An example of a difunctional phenolic dimer is ortho-ortho bonded p-cresol dimer or 2,2'-dihydroxy-5,5'-dimethyldiphenyl methane. It has a single open reactive site on each phenolic ring namely one ortho to each hydroxy group.

If a novolak resin is made by condensing an aldehyde source with the correct relative proportion of monofunctional and difunctional phenolic monomers, one would obtain a novolak resin wherein the interior phenolic moieties were difunctional moieties and the terminal phenolic groups were monofunctional in nature. It should be noted that monofunctional moieties must be terminal groups since once the single available reactive site is reacted during the novolak polymerization step, then there is no further reaction site on that monomeric moiety. In contrast, the difunctional phenolic monomers or dimers must be internal moieties on the novolak chain since the two available reactive sites will react with other phenolic moieties.

Accordingly, there is a need to make novolak resins which substantially eliminate the formation of scum in the developed images, yet have sufficient high thermal resistance properties to be useful in positive-working photoresists. The present invention is believed to be a solution to that need.

BRIEF DESCRIPTION OF THE INVENTION

Accordingly, the present invention is directed to an alkali-soluble novolak binder resin made by the condensation reaction of a mixture of phenolic monomers with at least one aldehyde source, said phenolic monomers consisting of:

(1) about 2–18% by weight of said mixture being 2,6-dimethylphenol;

(2) about 55–75% by weight of said mixture being 2,3-dimethylphenol; and (3) about 16–40% by weight of said mixture being a para-substituted lower alkyl phenol selected from the group consisting of 3,4-dimethylphenol, para-cresol, and para-cresol dimer;

the amount of said aldehyde source being at least a stoichiometric amount to react with all of said phenolic moieties.

Furthermore, the present invention is directed to a radiation-sensitive composition useful as a positive-working photoresist dissolved in a solvent comprising:

A. a photoactive compound; and

B. an alkali-soluble novolak binder resin made by the condensation reaction of a mixture of phenolic monomers with at least one aldehyde source, said mixture of phenolic monomers and consisting of:

(1) about 2–18% by weight of said mixture being 2,6-dimethylphenol;

(2) about 55–75% by weight of said mixture being 2,3-dimethylphenol; and (3) about 16–40% by weight of said mixture being para-substituted lower alkyl phenol selected from the group consisting of 3,4-dimethylphenol, para-cresol, and para-cresol dimer;

the amount of said aldehyde source being at least a stoichiometric amount to react with all of said phenolic moieties; and wherein the photoactive compound makes up from about 5% to about 40% by weight of the solids of said radiation-sensitive composition; and the alkali-soluble novolak resin makes up from about 95% to about 60% by weight of the solids in said radiation-sensitive composition.

DETAILED DESCRIPTION

As stated above, the present invention is drawn to a class of novolak resins and positive-working photoresists made therefrom. These novolak resins are prepared from a selected mixture of monofunctional and difunctional phenolic monomers.

A monofunctional phenolic monomer is defined herein as a phenolic compound having one phenyl ring and only one reactive site either ortho- or para- to the hydroxyl group. In other words, there is only one reactive site on the phenol ring for electrophilic aromatic substitution. 2,6-Dimethylphenol is a monofunctional phenolic monomer and its purpose is as chain terminators.

A difunctional phenolic monomer is defined herein as a phenolic component having one phenol ring and having two reactive sites, ortho- or para-, to the hydroxyl group. 2,3-Dimethylphenol and 3,4-dimethylphenol are difunctional monomers. The stated purpose of these difunctional monomers is as internal chain building blocks.

The present invention encompasses a mixture of a particular monofunctional phenolic monomer with two particular classes of difunctional monomers. The 3,4-dimethylphenol, para-cresol, and para-cresol dimer are used to provide ortho-, ortho-bonding to the novolak resin. The 2,3-dimethylphenol aids in the novolak's ability to withstand heat deformation during the lithographic process.

The amount of 2,6-dimethylphenol in the phenolic mixture is preferably about 10% to 16% by weight of the phenolic mixture. The amount of 2,3-dimethylphenol in the phenolic mixture is preferably about 58% to 67% by weight of the phenolic mixture. The amount of the para-substituted lower alkyl phenol is preferably from about 22% to about 35% by weight of the phenolic mixture.

In making the present class of alkali-soluble novolak resins, the monomeric phenolic precursors were reacted with an aldehyde source.

Any conventional aldehyde source used to make novolak resins may be employed herein. Formaldehyde, paraformaldehyde, acetaldehyde, haloacetaldehyde such as chloroacetaldehyde, trioxane, benzaldehydes, and the like and mixtures thereof are examples of such known aldehide sources. Formaldehyde is the preferred aldehyde source.

The reaction mixture usually also contains an acid catalyst and may include a solvent. Known acid catalysts used for making novolaks may be suitable for making these novolak resins of the present invention. Any conventional solvent used in novolak-forming reactions may also be used herein. Preferred solvents are alcoholic or ethereal solvents with boiling points between 80°-220° C. The most preferred solvents are ethanol, butanol, and 1-methoxy-2-propanol (also known as propylene glycol monomethyl ether), dipropylene glycol monomethyl ether, or other solvents. The mixture is then preferably heated to a temperature in the range from about 60° C. to about 120° C., more preferably from about 65° C. to about 99° C., for the novolak-forming condensation polymerization reaction to occur. If an aqueous medium is used instead of an organic solvent, the reaction temperature is usually maintained at reflux, e.g. about 95° to 110° C. The reaction time will depend on the specific reactants used and the ratio of aldehyde source to phenolic monomers. The mole ratio of aldehyde source to total phenolic moieties is generally about 1.01:1 to about 1.3:1, preferably from about 1.02:1 to about 1.25:1. Reaction times from 3 to 20 hours are generally suitable.

The above-discussed resins of the present invention may be mixed with photoactive compounds to make radiation-sensitive mixtures which are useful as positive acting photoresists. One preferred class of photoactive compounds (sometimes called sensitizers) is o-quinonediazide compounds particularly esters derived from polyhydric phenols, alkyl-polyhydroxyphenones, aryl-polyhydroxyphenones, and the like which can contain up to six or more sites for esterification. The most preferred o-quinonediazide esters are derived from o-naphthoquinone-(1,2)-diazide-4-sulfonic acid and o-naphthoquinone-(1,2)-diazide-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-5-sulfonic acid esters, 2,4-dihydroxybenzophenone 1,2-naphthoquinonediazide-5-sulfonic acid esters, 2,3,4-trihydroxyphenyl hexyl ketone 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinonediazide-5-sulfonic acid esters, 2,3,4,4'-tetra-hydroxybenzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4', 6'-pentahydroxybenzophenone 1,2-naphthoquinonediazide-5-sulfonic acid esters, and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-sulfonic acid esters, 2,2-bis(2,3,4-trihydroxyphenyl)propane 1,2-naphthoquinonediazide-sulfonic acid esters, 2,6-bis-[(2,3,4-trihydroxyphenyl)-methyl]-4-methylphenol 1,2-naphthoquinonediazide-5-sulfonic acid esters, and 2,6-bis[2,4,6-trihydroxyphenyl)methyl]-4-methylphenol 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, arylpolyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta- and hexa-esters of polyhydroxy compounds having at least 2 hydroxyl groups, i.e. about 2 to 6 hydroxyl groups, are most preferred.

Among these most preferred 1,2-naphthoquinone-5-diazide compounds are 2,3,4-trihydroxybenzophenone 1,2-naphthoquinonediazide-5-sulfonic acid esters; 2,2′,4,4′-tetrahydroxybenzophenone 1,2-naphthoquinonediazide-5-sulfonic acid esters; 2,6-bis-[(2,3,4-trihydroxyphenyl)methyl]-4-methylphenol 1,2-naphthoquinonediazide-5-sulfonic acid esters; and 2,6-bis[2,4,6-trihydroxyphenyl)methyl]-4-methylphenol 1,2-naphthoquinonediazide-5-sulfonic acid esters, and bis(2,6-dimethyl-4-hydroxyphenyl) (3-methoxy-4-hydroxyphenyl) methane 1,2-naphthoquinonediazide-5-sulfonic acid esters. These 1,2-quinonediazide compounds may be used alone or in combination of two or more.

Another preferred 1,2-naphthoquinone-5-diazide compounds are phenol 1,2-naphthoquinonediazide-5-sulfonic acid ester and bis[4-(2,6-dimethylphenol)]-4-catechol methane 1,2-naphthoquinone-5-diazide sulfonic acid esters.

Another preferred class of photoactive o-quinonediazide compounds is prepared by condensing spirobiindane or spirobichroman derivatives with 1,2-naphthoquinonediazido-4-sulfonyl chloride or 1,2-naphthoquinonediazide-5-sulfonyl chloride or a mixture thereof to make compounds of formula (A) shown below:

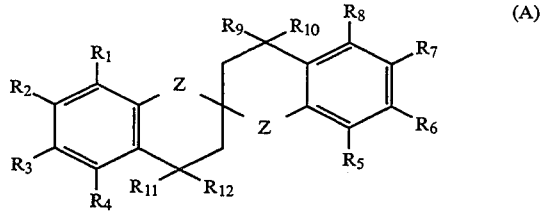

(A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group,

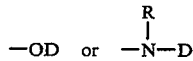

(wherein R is hydrogen, or an alkyl group, and D is a 1,2-naphthoquinonediazido-5-sulfonyl group or a 1,2-naphthoquinonediazido-4-sulfonyl group); $R_9$ to $R_{12}$ are independently hydrogen or a lower alkyl group; and Z is oxygen or a single bond (i.e. the latter forms a five-member ring); provided that at least one of $R_1$ to $R_8$ is

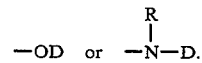

The halogen represented by $R_1$ to $R_8$ in the formula (A) is preferably chlorine, bromine or iodine.

The alkyl group is preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each akyl substituent having 1 to 4 carbon atoms, such as dimethylamino, diethylamino, dipropylamino, di-isopropylamino, di-n-butylamino, di-iso-butylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl, or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, sec-butylsulfamoyl, or tert-butylsulfamoyl.

The arylsulfamoyl group is preferably phenylsulfamoyl or tolylsulfamoyl.

The acyl group is preferably an aliphatic acyl group having 1 to 5 carbon atoms, such as formyl, acetyl, propionyl, butyryl, isobutyryl, valeryl, isovaleryl or pivaloyl, or an aromatic acyl group, such as benzoyl, toluoyl, salicyloyl, or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl, or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy, or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl, or tert-butyl.

In the formula (A) above, $R_1$ to $R_8$ are preferably a hydrogen atom, a hydroxy group or an —OD group wherein D is as defined above, and $R_9$ to $R_{12}$ are preferably a hydrogen atom or a methyl group. R is preferably an alkyl group having 1 to 4 carbon atoms, such as a methyl, ethyl, n-propyl, isopropyl, n-butyl, isobutyl, sec-butyl, or t-butyl group.

The proportion of the sensitizer compound in the radiation-sensitive mixture may preferably range from about 5 to about 40%, more preferably from about 10 to about 25% by weight of the solids or nonvolatile (e.g., nonsolvent) content of the radiation-sensitive mixture. The proportion of total binder resin of this present invention in the radiation-sensitive mixture may preferably range from about 60 to about 95%, more preferably, from about 75 to 90% of the solids or nonvolatile (e.g., excluding solvents) content of the radiation-sensitive mixture.

These radiation-sensitive mixtures may also contain conventional photoresist composition ingredients such as other resins, solvents, actinic and contrast dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresol-formaldehyde resins, phenol-cresol-formaldehyde resins and polyvinylphenol resins commonly used in the photoresist art. Haloacetaldehyde and other aldehyde sources may be used instead of formaldehyde for making these optional resins. If other binder resins are present, they will replace a portion of the binder resins of the present invention. Thus, the total amount of the binder resin in the radiation-sensitive composition will be from about 60% to about 95% by weight of the total nonvolatile solids content of the radiation-sensitive composition.

The resins and sensitizers are generally dissolved in a solvent or solvents to facilitate their application to the substrate. Examples of known photo-resist solvents include methoxyacetoxy propane, ethyl cellosolve acetate, n-butyl acetate, cyclopentanone, cyclohexanone, methyl ethyl ketone, diglyme, ethylene glycol monomethyl ether, ethylene glycol monoethyl ether, methyl lactate, ethyl lactate, ethyl 3-ethoxy propionate, propylene glycol alkyl ether acetates, xylene, or mixtures thereof and the like. The preferred solvent is ethyl lactate alone or in combination with ethyl 3-ethoxy propionate. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g. Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g., 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. No. 42514), Oil Blue N (C.I. No. 61555) and Calco Red A (C.I. No. 26125) up to 10% weight levels, based on the combined weight of resin and sensitizer.

Anti-striation agents level out the photo-resist coating or film to a uniform thickness. Anti-striation agents may be used up to five percent weight levels, based on the combined weight of resin and sensitizer. One suitable class of anti-striation agents is nonionic silicon-modified polymers. Nonionic surfactants may also be used for this purpose, including, for example, nonylphenoxy poly(ethyleneoxy) ethanol; octylphenoxy (ethyleneoxy) ethanol; and dinonyl phenoxy poly(ethyleneoxy) ethanol.

Plasticizers improve the coating and adhesion properties of the photoresist composition and better allow for the application of a thin coating or film of photoresist which is smooth and of uniform thickness onto the substrate. Plasticizers which may be used include, for example, phosphoric acid tri-(-β-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid or nitrocinnamic acid at weight levels of up to 20%, based on the combined weight of resin and sensitizer. Other known speed enhancers include polyhydroxy compounds such as resorcinol, phloroglucinol, 2,3,4-trihydroxybenzophenone, 2,3,4,4'-tetrahydroxybenzophenone, 2,3,4,3',4',5'-hexahydroxy-benzophenone, acetone pyrogallol condensate resins, and the like. Preferred speed enhancers include 2,6-bis[(2,3,4-trihydroxyphenyl)methylene]-4-methylphenol and 1-[1'-methyl-1'-(4'-hydroxyphenyl)ethyl] 4-[1',1'-bis(4-hydroxyphenyl)ethyl] benzene (also known as phenol, 4,4'-[1-[4-[1-(4-hydroxyphenyl)-1-methylethyl]phenyl]ethylidene]bis- or TRISP-PA). (This latter compound has CAS No. 110 726-28-8.)

The prepared radiation-sensitive resist mixture, can be applied to a substrate by any conventional method used in the photoresist art, including dipping, spraying, whirling and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum or polymeric resins, silicon dioxide, doped silicon dioxide, silicon resins, gallium arsenide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° to 125° C. until substantially all the solvent has evaporated and only a uniform light-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the soft bake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated and imaged wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLES

RESIN EXAMPLES 1-17

The novolak resins in Examples 1-17 were prepared by the following procedure:

The reactions were performed in a 500 mL 3-neck, round-bottom flask fitted with a mechanical stirring apparatus, Fredrichs condenser, and thermometer. The temperature was controlled using manually adjusted oil bath.

The phenolic monomers, dipropylene glycol monomethyl ether solvent, and formalin solution were weighed and added to the flask. The flask and contents were placed in an oil bath whose temperature was between 50° and 60° C. and stirring was begun. After all the solids had dissolved, oxalic acid dihydrate was added to the solution in one portion in hot deionized water, and the mixture was heated to 90°-95° C. internal temperature over 30-45 minutes and continued to heat at this temperature for 18 hours.

After heating for 18 hours, the Fredrichs condenser was arranged for downward distillation, a distilling head, vacuum adapter, and a round-bottom flask was fitted to the apparatus, and the oil bath temperature was raised to 200° C. for two hours. The distilling receiver was replaced with another flask, and the system was attached to a vacuum apparatus and full vacuum-about 2 mm Hg-was pulled on the system for four hours. Simultaneously, the bath temperature was raised to 220° C. After 4 hours, the vacuum was broken and the flask was removed from the oil bath. The solid novolak was removed from the flask after it had reached room temperature.

In Table I below, the following abbreviations are used: 3,4-DMP means 3,4-dimethylphenol; 2,3-DMP means 2,3-dimethylphenol; and 2,6-DMP means 2,6-dimethylphenol. The percent sign in front of each abbreviation means the mole percent of each reactant present in the reaction charge. The abbreviating % Cat. means the weight percent of oxalic acid dihydrate used in the reaction based on the total gram weight of the phenolic reactants. The abbreviation F/C means the mole ratio of formaldehyde present in the formalin solution used in each reaction divided by the total number of moles of phenols used in each reaction. NM means not measured. NS means not soluble. The SP ° C. means the softening point in degrees centigrade of the novolak as measured by the method described below. MW means the weight average molecular weight as determined by GPC using a Waters GPC system composed of a Waters No. 590 pump and Waters No. 410 Differential Refractometer. The eluent was tetrahydrofuran at a flow rate of 1 mL/min. A set of four Phenomenx Phenolgel 10 columns was used: 50 A, 100 A, 500 A, and 10,000 A.

The softening points, where measured, were determined using the apparatus described in the 1992-1993 VWR Catalog, page 1159, Item No. 52938-302.

The softening points were determined in the following manner. The ring was placed on a flat hot plate surface, and the novolak was placed in it. The novolak was fused under a steam of nitrogen by heating the hot plate. Additional novolak was added, if necessary, to make certain that the amount of solid completely filled the ring. After fusion, the hot plate was cooled. Two rings were prepared with a single novolak for each determination. The rings containing the fused novolak were placed on top of the fused novolak. The glycerine in the softening point apparatus was heated and stirred. As the novolak softens, the ball and novolak begin to drop to the plate below. The temperature at which the novolak/ball mass touches the lower plate is recorded as the novolak's softening point.

The yield is the proportion of the resin free from unreacted monomers obtained relative to the total amount of monomers charged into the reaction flask and is expressed as a percentage.

The Time to Clear ($T_c$) for the novolak resins was determined measuring the time required for a one micron resin film coated onto a silicon wafer to dissolve into an aqueous tetramethylammonium hydroxide (TMAH) solution. Examples 1–2 and 5–6 were measured on 2" wafers with 0.48N TMAH, and the remainder of the examples were measured on 4" wafers with 0.262N TMAH. The coating was obtained by pouring about 3 mL of a solution containing the polymer in 70/30 wt./wt. ethyl lactate/2-ethoxy ethylpropionate solution on to the wafer. The wafers were then spun at 500 rpm to spread the film and finally at 3,000–6,000 rpm to give the 1 micron film. These were softbaked on a vacuum chuck hot plate at 115° C. for 60 seconds. Film thicknesses were determined using a Prometrix SM200E profilometer and a Gaertner elispometer. The coated wafers were placed in the developer solution with good agitation and the time recorded. The elapsed time was recorded when the film completely dissolved as the time to clear.

RESIN EXAMPLES 18–29

The novolak resins 18–29 were prepared in the following manner:

The reactions were performed in a 500 ml 3-neck flask fitted with a mechanical stirring apparatus, thermometer, and Fredrichs condenser. The temperature was controlled using a programmable temperature controller purchased from the Ace Glass Company (Catalog No. 12115-30).

The phenolic monomers and dipropylene glycol monomethyl ether were added to the flask and the flask and contents were placed in an oil bath whose temperature was 60° C. and stirring was started. After all of the solids had dissolved, the formalin solution was added, and after reaction temperature had increased to between 50°–55° C., the oxalic acid dihydrate was added to the reaction mixture as a solution in deionized water. The container which contained the oxalic acid solution was rinsed with a few mL of hot deionized water. After the addition of the oxalic acid dihydrate, the following temperature program was initiated on the programmable temperature controller: heat the oil bath at temperature of 60° C. for 30 mins., heat the oil bath to a temperature of 105° C. over 45 mins., heat the oil bath at a temperature of 105° C. for 18 hours, heat the oil bath to a temperature of 200° C. over 30 mins., continue heating at a bath temperature of 200° C. for 90 mins, heat the bath temperature to 220° C. over 10 mins., continue heating at 220° C. for 3 hours, 50 mins., and discontinue heating the oil bath.

In concert with the temperature program, the following operations were performed: after heating at 105° C. for 18 hours, the reaction flask was fitted with a distilling head, receiver adapter, and collection flask and the atmospheric distillate was collected. After heating at 200° C. for 90 mins., the atmospheric collection flask was replaced with another receiver and full vacuum-about 2 mm Hg was pulled on the system for 4 hours. After 4 hours time, the vacuum was broken and the flask and contents were removed from the oil bath. The novolak was recovered from the flask after the flask and contents had cooled to room temperature.

The results are shown in Table I, along with those of Resin Examples 1–17.

TABLE I

| Example # | % 3, 4-DMP | % 2, 3-DMP | % 2, 6-DMP | F/C | % Cat. | Mw | SP °C. | Yield | Tc |
|---|---|---|---|---|---|---|---|---|---|
| 1 | 20 | 65 | 15 | 1.05 | 5 | 2396 | 158–160 | 99 | 299 |
| 2 | 20 | 70 | 10 | 1.05 | 5 | 2844 | 169–171 | 98.9 | 448 |
| 3 | 50 | 35 | 15 | 1.05 | 5 | 1764 | 149–150 | 98.7 | 48000 |
| 4 | 50 | 45 | 5 | 1.05 | 5 | 2287 | 166–168 | 100 | NS |
| 5 | 65 | 20 | 15 | 1.05 | 5 | 1839 | 153 | 95 | NS |
| 6 | 70 | 20 | 5 | 1.05 | 5 | 2288 | 168–170 | 96.3 | NS |
| 7 | 24 | 64 | 12 | 1.05 | 5 | 2382 | 166 | 99.5 | 515 |
| 8 | 32 | 58 | 10 | 1.05 | 5 | 2410 | 165–167 | 100 | 1136 |
| 9 | 26 | 62 | 12 | 1.05 | 5 | 2954 | NM | 98 | 966 |
| 10 | 28 | 60 | 12 | 1.05 | 5 | 2742 | NM | 97.8 | 568 |
| 11 | 30 | 58 | 12 | 1.05 | 5 | 2550 | NM | 100 | 580 |
| 12 | 32 | 56 | 12 | 1.05 | 5 | 2367 | NM | 100 | 966 |
| 13 | 34 | 54 | 12 | 1.05 | 5 | 2263 | NM | 99.5 | 1550 |
| 14 | 36 | 52 | 12 | 1.05 | 5 | 2282 | NM | 98.9 | 2700 |
| 15 | 38 | 50 | 12 | 1.05 | 5 | 2241 | NM | 99.1 | 3851 |
| 16 | 42 | 51 | 7 | 1.05 | 5 | 2154 | NM | 100 | 7600 |
| 17 | 51 | 38 | 11 | 1.05 | 5 | 2493 | NM | 99.1 | 3861 |
| 18 | 26 | 62 | 12 | 1.12 | 5 | 2293 | NM | 99.2 | 220 |
| 19 | 26 | 62 | 12 | 1.08 | 5 | 2566 | NM | 98.2 | 407 |
| 20 | 26 | 62 | 12 | 1.05 | 7 | 2420 | NM | 100 | 284 |
| 21 | 26 | 62 | 12 | 1.05 | 9 | 2396 | NM | 96.7 | 267 |
| 22 | 26 | 62 | 12 | 1.12 | 5 | 2519 | NM | 98.9 | 416 |
| 23 | 26 | 62 | 12 | 1.12 | 5 | 2488 | NM | 97.7 | 449 |
| 24 | 26 | 62 | 12 | 1.12 | 9 | 3094 | NM | 97.2 | >1000 |
| 25 | 26 | 62 | 12 | 1.08 | 7 | 2627 | NM | 100 | 477 |
| 26 | 26 | 62 | 12 | 1.05 | 5 | 2366 | NM | 98.7 | 230 |

TABLE I-continued

| | | RESIN EVALUATION | | | | | | | |
|---|---|---|---|---|---|---|---|---|---|
| Example # | % 3, 4-DMP | % 2, 3-DMP | % 2, 6-DMP | F/C | % Cat. | Mw | SP °C | Yield | Tc |
| 27 | 28 | 60 | 12 | 1.05 | 5 | NM | NM | 98.4 | 388 |
| 28 | 30 | 58 | 12 | 1.05 | 5 | NM | NM | 98.8 | 580 |
| 29 | 24 | 62 | 12 | 1.05 | 5 | NM | NM | 97.7 | 616 |

PHOTORESIST EXAMPLES 1-58
PREPARATION OF PHOTORESISTS

58 Positive working photoresist compositions were prepared from (1) selected novolak resins made above, (2) a photoactive compound (PAC), (3) a speed enhancing agent (SE), (4) a leveling agent, and (5) coating solvents by the following general procedure. These five components were used in each resist example. Two photoactive compounds were used to prepare these photoresists. These two PAC's were (1) 2,6-bis[2,3,4-trihydroxyphenyl)methyl]4-methyl phenol esterified with 6 equivalents of 1,2-naphthoquinonediazide-5-sulfonyl chloride (referred to as PS-9 in Table 2) and (2) bis(2,6-dimethyl-4-hydroxyphenyl)(3-methoxy-4-hydroxyphenyl)methane esterified with 3 equivalents of 1,2-naphthoquinonediazide-5-sulfonyl chloride (referred to as PS-11 in Table II). The speed enhancing agent used in each photoresist was 1-[1'-methyl-1'-(4'-hydroxyphenyl)ethyl]4-[1',1'-bis-(4-hydroxyphenyl)ethyl] benzene (TRISP-PA). The solvent used in each photoresist was a 70/30 weight percent mixture of ethyl lactate and ethyl 3-ethoxypropionate respectively. An alkyl resin/silicone surfactant leveling agent (FLUORAD FC-430 produced by 3M) was added to each photoresist composition.

The chosen photoactive compound (PAC) was charged to a 50 ml brown glass bottle. Each novolak was modified to have a 60 second $T_c$, by adding a speed enhancing agent adjust for alkaline solubility. A solution of the novolak resin in ethyl lactate was added to this bottle to give the correct PAC/Resin ratio. The leveling agent (alkyl resin/silicone surfactant) was added to give a final concentration of 0.3 weight percent. Further solvent was added to give a nominal 27% solids mixture to allow for coating of the composition to 1.2 microns on a silicon wafer. This final photoresist mixture was mixed until homogeneous and finally filtered through a 0.2 micron filter.

The photoresist formulations made are shown in Table 2. As can be seen, the column labeled resin example refers to the novolak binder resin identified in Table 1. The column labeled PAC type refers to which of the two photoactive compounds were used in formulating the photoresist. The column labeled Ester'n Level refers to the esterification level of 1,2-naphthoquinonediazide-5-sulfonyl chloride. The column PAC/Resin+SE refers to the weight ratio of the selected PAC to the solid novolak plus the speed enhancing agent. The column SE/SE+Resin refers to the weight ratio of speed enhancing agent to the speed enhancing agent plus the resin.

COATING, SOFTBAKING, EXPOSURE, POST EXPOSURE BAKING, AND DEVELOPING OF THE PHOTORESIST

Films of the formulated photoresists were prepared for imaging, exposed and developed according to the following general procedure:

The wafers were coated on a spin coater by applying 3 ml of photoresist formulation shown in Table II to the static wafer. The wafer was then spun at 500 rpm to spread the film, and finally at 3,000 to 6,000 rpm to give 1.2 micron film. These photoresist coated wafers were then softbaked on a vacuum chuck hot plate at 90° C. for 60 seconds to remove residual solvent. The softbaked photoresist coated wafers were exposed for lithographic evaluation properties as well as the dissolution rate properties.

The dissolution properties were measured by exposing the softbaked wafers to 436 nm light (G-line) using a GCA projection exposure tool with a numerical aperture of 0.30. With the exception of resist Examples 1 and 2, the lithographic properties were measured by exposing the softbaked wafers to 365 nm light (I-line) using a GCA projection exposure tool with a numerical aperture of 0.45. The lithographic properties resist Examples 1 and 2 were measured by exposing the softbaked wafers to 436 nm light (G-line) using a Canon projection exposure tool with a numerical aperture of 0.48. The exposure energy was controlled by the time a shutter was open allowing the light to strike the photoresist film.

After completion of exposure, the wafers were subjected to a post exposure bake (PEB) to lessen or remove the standing waves from the exposure. This was done using the vacuum chuck hot plate at 120° C. for 60 seconds. Following the PEB the wafers were developed using 0.26N tetramethyl-ammonium hydroxide. A Perkin Elmer Development rate monitor was used to measure the dissolution rate of the exposed areas. The wafer exposed for lithographic evaluation were developed using a track system. With the track system, the wafers were spun and sprayed with the developer for 5 seconds, the spinning was stopped for the last 2 seconds of the spray. The wafer remained stationary for 60 seconds while development occurs. A deionized water rinse was applied for 20 seconds while spinning, followed by dry nitrogen gas to dry the wafer. The wafer was then ready for lithographic evaluation.

EVALUATION OF THE PHOTORESISTS

Each imaged photoresist-coated substrate was evaluated for several important properties. The tangent of the angle of the slope of the dissolution rate vs. exposure curve (Tan Theta); optimum photospeed (Eopt); profile of the imaged line/space pairs (Profile); line/space pair resolution (Res.); depth-of-focus of 0.50 micron line/space pairs (DOF); and resistance to flow when heated (Resist Flow).

From the Perkin Elmer Development Rate Monitor, a plot of dissolution rate vs. exposure energy can be made. At low exposures, the resist has a very low dissolution rate in alkaline developer. When the exposure energies are increased, the rate of dissolution increases dramatically. The slope of this switching action can be measured by taking the tangent of the angle of the slope created. The tan theta measurement is a measure of how quickly the resist can go from being a dissolution inhibitor to a dissolution enhancer. Generally, the higher the tan theta, the better the resist will perform lithographically. This technique is used as a screening procedure to test the capability of new resins.

The optimum exposure energy (Eopt) was determined as the energy required to replicate the dimensions of the mask for line/space pairs. Values between 80–240 mJ/sq cm are acceptable for the evaluation. A value less than this indicates the photoresist film is too sensitive to the light while a value greater than this indicates the sensitivity is too low.

The profile of the line/space pairs (Profile) is evaluated as the ability of the photoresist to maintain a consistent width throughout the depth of the film. Highly sloped sidewalls are undesirable and rate a 1 on a scale of 1–5. Highly vertical sidewalls are very desirable and rate a value of 5. Intermediate profiles are given a rating between the two extremes.

The resolving power (Res.) of the photoresist film is determined as the minimum line/space pair features which are cleared at the Eopt. These are reported as the distance between lines in microns. Generally, the lower the resolution values, the better the resist would perform.

The depth-of-focus (DOF) is a measure of the focus latitude of the photoresist corresponding to a change in the best focus used to create an image. When the focal plane of projected images is shifted above and below the resist plane, the line/space pairs created in the photoresist will become deformed, due to the poor aerial transfer. The total range (microns), in which the focus can vary and still meet the following criteria is defined as the DOF.

The profile of the line/space pairs created at best focus should be maintained consistently throughout different focus levels. The best focus level is that which yields the minimum resolution. The width of the line of the line/space pair created at best focus should not vary more than 10% of nominal, as the focus level is changed. There should be no reduction in height from the image created at best focus, as the focus level is changed. The DOF for 0.50 micron line/space pairs are reported. The greater the DOF, the more desirable the photoresist becomes.

The ability of the developed photoresist image to resist deformation due to heat generated during process steps is known as heat resistance. This is determined by subjecting portions of the imaged wafer to a heated hot plate for 4 mins. This is done for several temperatures (e.g., 100°–150° C. range). The coated wafer chip is inspected for flow of the images (i.e., image deformation) adjacent to bulk areas of the film. The temperature, where significant flow of the featured sidewalls are noted, is referred to as the Resist Flow Temperature. Value of 115°–120° C. are considered minimum for a commercial photoresist.

TABLE II

Photoresist Evaluations

| Resist Example | Resin Example | PAC Type | Ester'n Level | PAC/ Resin + SE | SE/SE + Resin | Tan Theta | Eopt MJ/sq cm | Profile | Res. Line/Sp (um) | DOF .50 um Line/Sp | Resist Flow (°C.) |
|---|---|---|---|---|---|---|---|---|---|---|---|
| 1 | 7 | PS-9 | 63.0 | 18/82 | 10.2/89.8 | NM | 165 | 1 | 0.55 | NM | 125 |
| 2 | 8 | PS-9 | 63.0 | 18/82 | 19.4/80.6 | NM | 290 | 4 | 0.47 | NM | 120 |
| 3 | 7 | PS-9 | 63.0 | 17/83 | 10.0/90.0 | 2.10 | NM | NM | NM | NM | NM |
| 4 | 24 | PS-9 | 63.0 | 17/83 | 20.0/80.0 | 5.17 | NM | NM | NM | NM | NM |
| 5 | 9 | PS-9 | 63.0 | 17/83 | 16.5/83.5 | 4.20 | NM | NM | NM | NM | NM |
| 6 | 25 | PS-9 | 63.0 | 17/83 | 14.0/86.0 | 3.44 | NM | NM | NM | NM | NM |
| 7 | 26 | PS-9 | 63.0 | 17/83 | 8.0/92.0 | 2.10 | 160 | 2.5 | 0.4 | 0.9 | NM |
| 8 | 10 | PS-9 | 63.0 | 17/83 | 16.5/83.5 | NM | NM | NM | NM | NM | NM |
| 9 | 27 | PS-9 | 63.0 | 17/83 | 14.0/86.0 | 3.50 | NM | NM | NM | NM | NM |
| 10 | 11 | PS-9 | 63.0 | 17/83 | 14.0/86.0 | 4.00 | NM | NM | NM | NM | NM |
| 11 | 12 | PS-9 | 63.0 | 17/83 | 16.5/83.5 | 3.30 | NM | NM | NM | NM | NM |
| 12 | 8 | PS-9 | 63.0 | 17/83 | 16.5/83.5 | 3.60 | NM | NM | NM | NM | NM |
| 13 | 13 | PS-9 | 63.0 | 17/83 | 19.5/81.5 | 3.20 | NM | NM | NM | NM | NM |
| 14 | 14 | PS-9 | 63.0 | 17/83 | 21.0/79.0 | 3.00 | NM | NM | NM | NM | NM |
| 15 | 15 | PS-9 | 63.0 | 17/83 | 23.0/77.0 | 3.00 | NM | NM | NM | NM | NM |
| 16 | 9 | PS-11 | 27.2 | 17.9/82.1 | 18/82 | 6.00 | NM | NM | NM | NM | NM |
| 17 | 9 | PS-11 | 44.9 | 15.3/84.7 | 20/80 | 5.40 | 220 | 4.5 | 0.51 | NM | NM |
| 18 | 9 | PS-9 | 63.0 | 20/80 | 20/80 | 4.80 | 134 | 2.5 | 0.41 | 1.5 | NM |
| 19 | 9 | PS-9 | 63.0 | 18/82 | 16/84 | 6.80 | 190 | 2 | 0.4 | NM | NM |
| 20 | 9 | PS-9 | 63.0 | 17/83 | 20/80 | 4.30 | 120 | 2.5 | 0.4 | 1.2 | NM |
| 21 | 9 | PS-9 | 63.0 | 17/83 | 18/82 | 4.10 | 125 | 2.5 | 0.4 | 1.2 | 120 |
| 22 | 9 | PS-9 | 63.0 | 17/83 | 16/84 | 4.20 | NM | NM | NM | NM | NM |
| 23 | 9 | PS-9 | 63.0 | 16/84 | 20/80 | 3.90 | 88 | 2.5 | 0.45 | 1.2 | NM |
| 24 | 9 | PS-9 | 63.0 | 16/84 | 16/84 | 6.00 | 160 | 2.5 | 0.4 | 1.2 | NM |
| 25 | 9 | PS-9 | 63.0 | 12.0/88.0 | 20/80 | 2.90 | NM | NM | NM | NM | NM |
| 26 | 26 | PS-11 | 29.0 | 16.3/83.7 | 12.0/88.0 | 1.80 | 95 | 2 | 0.57 | NM | NM |
| 27 | 26 | PS-11 | 36.6 | 20.2/79.8 | 12.0/88.0 | 4.10 | 105 | 4.5 | 0.45 | 1.5 | NM |
| 28 | 26 | PS-11 | 29.0 | 19.8/80.2 | 10.0/90.0 | NM | 140 | 2 | 0.52 | NM | NM |
| 29 | 26 | PS-11 | 29.0 | 22.4/77.6 | 10.0/90.0 | NM | 150 | 2.5 | 0.5 | NM | NM |
| 30 | 26 | PS-11 |  | 19.8/80.2 | 8.0/92.0 | 1.90 | 190 | 2 | 0.52 | NM | NM |
| 31 | 7 | PS-11 | 36.6 | 24.6/75.4 | 10.0/90.0 | NM | 240 | NM | 0.42 | 1.5 | NM |
| 32 | 19 | PS-11 | 36.6 | 24.6/75.4 | 14.0/86.0 | 5.3 | 230 | NM | 0.42 | 1.8 | NM |
| 33 | 19 | PS-11 | 36.6 | 24.6/75.4 | 16.0/84.0 | 8.8 | 240 | NM | 0.42 | 1.8 | NM |
| 34 | 19 | PS-11 | 42.3 | 24.6/75.4 | 16.0/84.0 | 6.9 | >240 | NM | NM | NM | NM |
| 35 | 19 | PS-11 | 49.8 | 24.6/75.4 | 16.0/84.0 | 8.4 | >240 | NM | NM | NM | NM |
| 36 | 19 | PS-11 | 36.6 | 22.9/77.1 | 16.0/84.0 | 6.60 | 230 | 3.5 | 0.41 | 2.1 | NM |
| 37 | 19 | PS-11 | 42.3 | 22.9/77.1 | 16.0/84.0 | 7.30 | 240 | 3.5 | 0.41 | NM | NM |
| 38 | 19 | PS-11 | 49.8 | 22.9/77.1 | 16.0/84.0 | 6.60 | >240 | NM | NM | NM | NM |
| 39 | 19 | PS-11 | 36.6 | 21.1/78.9 | 16.0/84.0 | 6.20 | 210 | 4.5 | 0.4 | 1.8 | NM |
| 40 | 19 | PS-11 | 42.3 | 21.1/78.9 | 16.0/84.0 | 6.40 | 230 | 4 | 0.41 | 1.8 | NM |
| 41 | 19 | PS-11 | 49.8 | 21.1/78.9 | 16/84 | 5.00 | >240 | NM | NM | NM | NM |
| 42 | 19 | PS-11 | 60.4 | 19/81 | 16/84 | 6.30 | >240 | NM | NM | NM | NM |
| 43 | 19 | PS-11 | 26.0 | 23/77 | 17/83 | 4.70 | 130 | 4 | 0.42 | NM | NM |

TABLE II-continued

Photoresist Evaluations

| Resist Example | Resin Example | PAC Type | Ester'n Level | PAC/ Resin + SE | SE/SE + Resin | Tan Theta | Eopt MJ/sq cm | Profile | Res. Line/Sp (um) | DOF .50 um Line/Sp | Resist Flow (°C.) |
|---|---|---|---|---|---|---|---|---|---|---|---|
| 44 | 19 | PS-11 | 26.0 | 21/79 | 17/83 | 3.10 | NM | NM | NM | NM | NM |
| 45 | 19 | PS-11 | 26.0 | 19/81 | 17/83 | 2.80 | NM | NM | NM | NM | NM |
| 46 | 19 | PS-11 | 26.0 | 23/77 | 19/81 | 4.00 | 130 | 4 | 0.43 | 1.8 | NM |
| 47 | 19 | PS-11 | 26.0 | 21/79 | 19/81 | 2.90 | NM | NM | NM | NM | NM |
| 48 | 19 | PS-11 | 26.0 | 19/81 | 19/81 | 2.40 | NM | NM | 0.42 | 1.5 | NM |
| 49 | 25 | PS-11 | 36.0 | 21/79 | 17/83 | 4.70 | 190 | 4 | 0.4 | 1.5 | NM |
| 50 | 23 | PS-11 | 36.0 | 21/79 | 16/84 | 6.90 | 150 | NM | 0.43 | 1.6 | NM |
| 51 | 22 | PS-11 | 36.0 | 21/79 | 16/84 | 5.30 | 160 | NM | 0.45 | NM | NM |
| 52 | 23 | PS-11 | 30.0 | 21/79 | 16/84 | 3.40 | NM | NM | NM | NM | NM |
| 53 | 23 | PS-11 | 30.0 | 21/79 | 13.2/86.8 | 4.00 | NM | NM | NM | NM | NM |
| 54 | 28 | PS-11 | 36.0 | 23/77 | 17/83 | 8.20 | 260 | 3.5 | 0.42 | 0.9 | NM |
| 55 | 28 | PS-11 | 36.0 | 21/79 | 17/83 | 5.80 | 250 | 3 | 0.42 | 1.2 | NM |
| 56 | 28 | PS-11 | 30.0 | 23/77 | 17/83 | 5.60 | 210 | 3.5 | 0.45 | NM | NM |
| 57 | 28 | PS-11 | 30.0 | 21/79 | 17/83 | 5.90 | 220 | 3 | 0.42 | 1.2 | NM |
| 58 | 29 | PS-11 | 36.0 | 21/79 | 17/83 | NM | 170 | 3.5 | 0.47 | NM | NM |

NOTE:
NM = Not Measured

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A radiation-sensitive composition useful as a positive-working photoresist dissolved in a solvent comprising an admixture of:
   (A) a photoactive compound;
   (B) an alkali-soluble novolak binder resin made by the condensation reaction of a mixture of phenolic monomers with at least one aldehyde source, said phenolic monomers consisting of:
      (1) about 2–18% by weight of said mixture being 2,6-dimethylphenol;
      (2) about 55–75% by weight of said mixture being 2,3-dimethylphenol; and
      (3) about 16–40% by weight of said mixture being a para-substituted lower alkyl phenol selected from the group consisting of 3,4-dimethylphenol, para-cresol, and para-cresol dimer;
   the amount of said aldehyde source being at least a stoichiometric amount to react with all of said phenolic moieties; and wherein the photoactive compound is from about 5% to about 40% by weight of the solids in said radiation-sensitive composition; and the alkali-soluble novolak resin is from about 95% to about 60% by weight of the solids in said radiation-sensitive composition.

2. A radiation-sensitive composition useful as a positive-working photoresist dissolved in a solvent comprising an admixture of:
   A. a photoactive compound; and
   B. an alkali-soluble novolak binder resin made by the condensation reaction of a mixture of phenolic monomers with formaldehyde, said mixture of phenolic monomers consisting of:
      (1) about 10–16% by weight of said mixture being 2,6-dimethylphenol;
      (2) about 58–67% by weight of said mixture being 2,3-dimethylphenol; and
      (3) about 22–35% by weight of said mixture being 3,4-dimethylphenol;
   wherein the mole ratio of said formaldehyde to total phenolic moieties is at least about 1.01:1 to about 1.3:1; and wherein the photoactive compound is from about 5% to about 40% by weight of the solids in said radiation-sensitive composition, and the alkali-soluble novolak resin is from about 95% to about 60% by weight of the solids in said radiation-sensitive composition.

3. The radiation-sensitive composition of claim 1 wherein the percentage of said 2,6-dimethylphenol is from about 10% to about 16% by weight of said phenolic mixture.

4. The radiation-sensitive composition of claim 1 wherein the percentage of said 2,3-dimethylphenol is from about 58% to about 67% by weight of said phenolic mixture.

5. The radiation-sensitive composition of claim 1 wherein the percentage of said para-substituted lower alkyl phenol is from about 22% to about 35% by weight of said phenolic mixture.

6. The radiation-sensitive composition of claim 1 wherein said para-substituted lower alkyl phenol is 3,4-dimethylphenol.

7. The radiation-sensitive composition of claim 1 wherein the mole ratio of said aldehyde source to total phenolic moieties is at least about 1.01:1 to about 1.3:1.

8. The novolak resin of claim 1 wherein said aldehyde source is formaldehyde.

* * * * *